United States Patent [19]

Akao et al.

[11] Patent Number: 4,937,592
[45] Date of Patent: Jun. 26, 1990

[54] IMAGE RECORDING—OF RECORDING SHEETS

[75] Inventors: Michitoshi Akao, Nagoya; Kenji Sakakibara, Ichinomiya; Shigeyuki Hayashi; Jun Sakai, both of Nagoya, all of Japan

[73] Assignee: Brother Kogyo Kabushiki Kaisha, Nagoya, Japan

[21] Appl. No.: 320,855

[22] Filed: Mar. 8, 1989

Related U.S. Application Data

[63] Continuation of Ser. No. 79,095, Jul. 29, 1987, abandoned.

[30] Foreign Application Priority Data

Jul. 31, 1986 [JP] Japan .................. 61-181269
May 12, 1987 [JP] Japan .................. 62-116388

[51] Int. Cl.$^5$ ............................ G01D 15/16
[52] U.S. Cl. ..................... 346/134; 355/24; 355/202
[58] Field of Search ........ 346/134; 355/35 H, 14 SH, 355/24, 202

[56] References Cited

U.S. PATENT DOCUMENTS 2,344,558  3/1944  Moore .
2,918,857  12/1959 Franz .
3,472,592  10/1969 Nichols et al. .
4,082,446  4/1978  Driscoll et al. .
4,260,246  4/1981  Rollenitz .
4,272,180  6/1981  Satomi et al. .................... 355/24
4,350,434  9/1982  Paulus et al. .
4,399,209  8/1983  Sanders et al. .
4,440,846  4/1984  Sanders et al. .
4,501,809  2/1985  Hiraishi et al. .
4,609,283  9/1986  Murata et al. .................. 355/14 SH
4,624,560  11/1986 Beery .
4,794,425  12/1988 Sakai et al. .

FOREIGN PATENT DOCUMENTS 0159569  10/1985  European Pat. Off. .
2577472   8/1986   France .
58-88739  5/1983   Japan .
58-88740  5/1983   Japan .
61-29877  2/1986   Japan .
61-92884  5/1986   Japan .
61-134778 6/1986   Japan .
2172173A  10/1986  United Kingdom .
2188168   9/1987   United Kingdom .

OTHER PUBLICATIONS

Patent Abstracts of Japan, vol. 9, No. 2, (P-325) (1725) Jan. 8, 1985.

Primary Examiner—Leo P. Picard
Assistant Examiner—Lincoln Donovan
Attorney, Agent, or Firm—Jones, Tullar & Cooper

[57] ABSTRACT

In an image recording apparatus, a desired recording sheet is automatically selected from a sheet feeding section that is provided with plural types of image recording sheets at least one of which is a photosensitive and pressure-sensitive recording sheet, based on encoded data that corresponds to the individual types of recording sheets. The selected recording sheet is fed through feeding means to an image recording section where an image recording operation is performed in accordance with the type of the selected sheet.

12 Claims, 12 Drawing Sheets

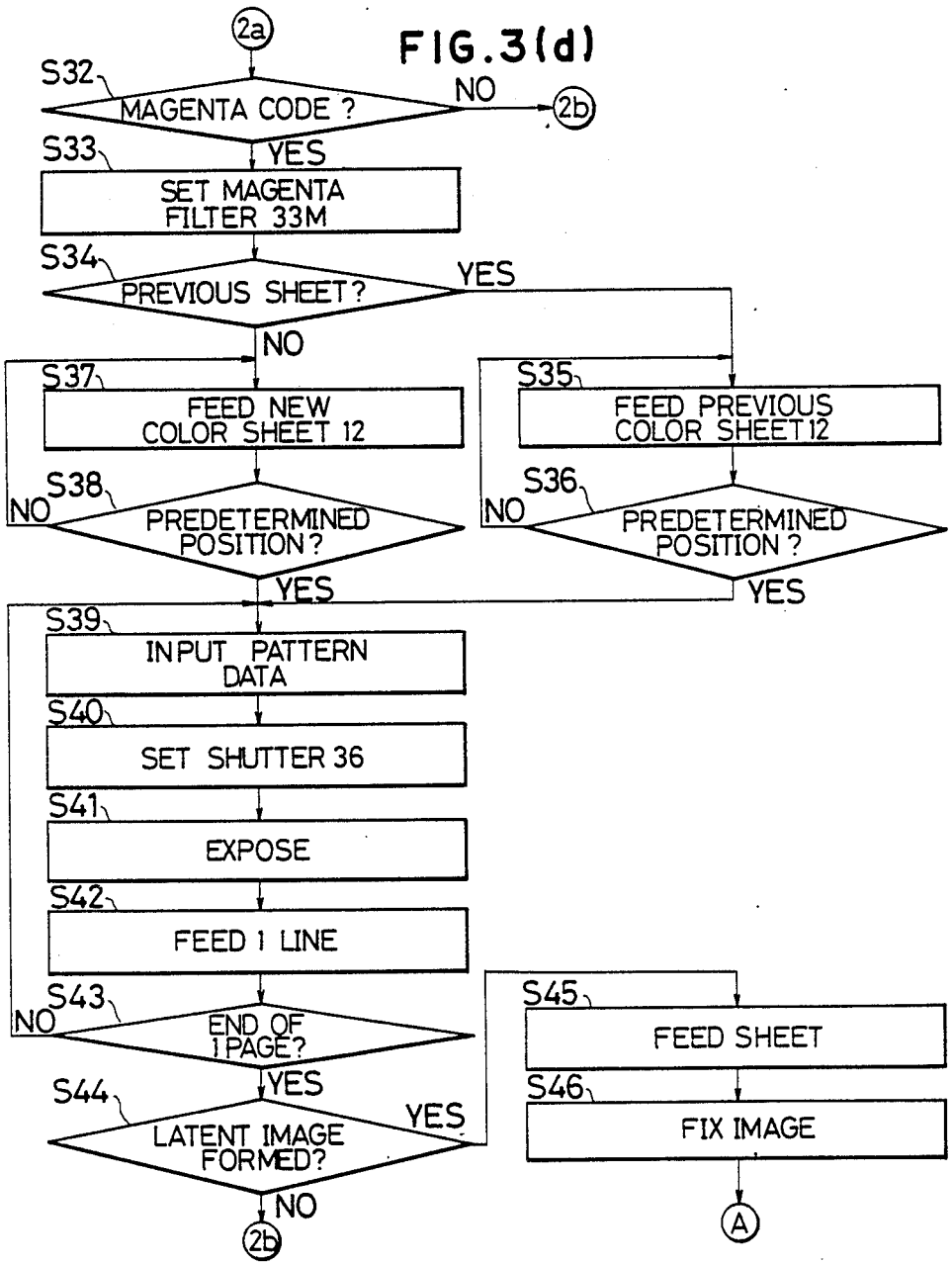

IMAGE RECORDING—OF RECORDING SHEETS

This is a continuation of co-pending application Ser. No. 07/079,095 filed on July 29, 1987, now abandoned.

BACKGROUND OF THE INVENTION

The present invention relates to an image recording apparatus, which is provided with plural types of recording sheets that differ, for example, in size, as recording media to record image information of an original or the like, and is capable of selecting a desired type from the recording sheets for recording image information thereon. This type of image recording apparatus is adapted for use in copying apparatuses, printers, and the like.

For instance, a known copying apparatus equipped with the image recording apparatus of this type is designed to permit an operator to manually select a desired one from plural types of recording sheets or copying sheets different in size and provide a copy using xerography.

Recently, however, various types of recording techniques have been developed and different types of recording sheets have appeared, accordingly.

A photosensitive and pressure-sensitive recording sheet is one of the recording media that are receiving the greatest attention today.

The photosensitive and pressure-sensitive recording sheet has a plurality of micro capsules on its surface which become hardened upon reception of light and are soft when receiving no light. When pressure is applied to this sheet, the hardened micro capsules are not ruptured while the soft micro capsules, which have been shielded from light by a shielding member, are ruptured. Consequently, the photosensitive and pressure-sensitive recording sheet is colored by the chromogenic materials encapsulated in the micro capsules. An image recording apparatus provided with a photosensitive and pressure-sensitive recording sheet, particularly of a color type is characterized by its significantly low manufacturing cost and simple structure, as compared with a conventional color image recording apparatus which forms a color image on a recording sheet. Further, when the image recording apparatus provided with a monochromatic photosensitive and pressure-sensitive recording sheet is used as a copying apparatus, it is more compact than conventional copying apparatuses.

One type of photosensitive and pressure-sensitive recording sheet is a transfer type of a recording sheet, which is disclosed, for example, in U.S. Pat. No. 4,399,209. According to the transfer type of recording sheet, a first sheet having a layer of pressure rupturable micro capsules coated on a substrate cooperates with a second sheet having a layer of a developer material that is coated on another substrate. When these two sheets overlap one upon another, the developer material reacts with the chromogenic material encapsulated in the ruptured micro capsules so that a predetermined image is transferred from the first sheet onto the second sheet.

Another type of a recording sheet, a so-called self-chromogenic type, which has both the layer of micro capsules and the layer of a developer material formed on the same substrate, is disclosed in U.S. Pat. No. 4,440,846. No image recording apparatus has been developed yet, which is provided with plural types of recording sheets that includes at least one of the aforementioned types of the photosensitive and pressure-sensitive recording sheets and which is capable of selecting a desired type of a recording sheet and recording image information thereon. Development of such an image recording apparatus should satisfy the condition that the desired type of recording sheets be properly selected. If not, for example, a monochromatic image may be erroneously formed on a color photosensitive and pressure-sensitive recording sheet or an image may be on only one surface of the double-side photosensitive and pressure-sensitive recording sheet, thus resulting in an increase in the running cost. Therefore, there is a demand for an easy and solid solution to this problem.

The selection of the desired type recording sheet may be manually executed by an operator; however, such an operation is likely to be erroneous and is troublesome. This problem also needs to be addressed.

SUMMARY OF THE INVENTION

With the above situation in mind, therefore, it is an object of the present invention to provide an image recording apparatus, which is provided with plural types of recording sheets and is capable of automatically and properly selecting a desired type of recording sheet, thus preventing an increase in the running cost due to the otherwise possible erroneous selection of the recording sheets and eliminating the troublesome operation.

To achieve the object, the image recording apparatus according to this invention is designed such that a sheet feeding section is provided with plural types of recording sheets at least one of which is a photosensitive and pressure-sensitive recording sheet, and selection means is provided to select a type of these recording sheets, whereby a desired type of a recording sheet is selected by the selection means under the control of control means, and it is fed from the sheet feeding section to an image recording section and is subjected to an image formation by image recording means.

This structure eliminates the need for an operator to manually select a desired recording sheet and thus eliminates the otherwise necessary troublesome operation. Further, the erroneous selection of the recording sheets can be prevented, thus preventing the running cost from increasing.

Electrically encoded data (called a sheet code) corresponding to the individual types of the recording sheets is set as the selection means, and when one type of a recording sheet is selected by using such a sheet code, this recording sheet is fed to the image recording section which in turn is controlled to form an image onto the recording sheet. This permits the proper sheet to be automatically selected and causes the image recording section to be controlled according to the selected sheet. Therefore, it is unnecessary for the operator to manually select a desired recording sheet and the erroneous selection of the recording sheets can be prevented, thus reducing the running cost. The image recording section, which forms an image on a selected one of plural types of recording sheets, always provides a stable and accurate image and is significantly simple.

Other objects and advantages will become more apparent as a detailed description of the preferred embodiments of this invention presented below proceeds with reference to the accompanying drawings.

BRIEF DESCRIPTION OF THE DRAWINGS

FIGS. 3(a) to 3(g) are flowcharts illustrating a sequence of image recording operations;

DESCRIPTION OF THE PREFERRED EMBODIMENTS

Embodiments of an image recording apparatus according to this invention will now be explained with reference to the accompanying drawings.

Figure 1:
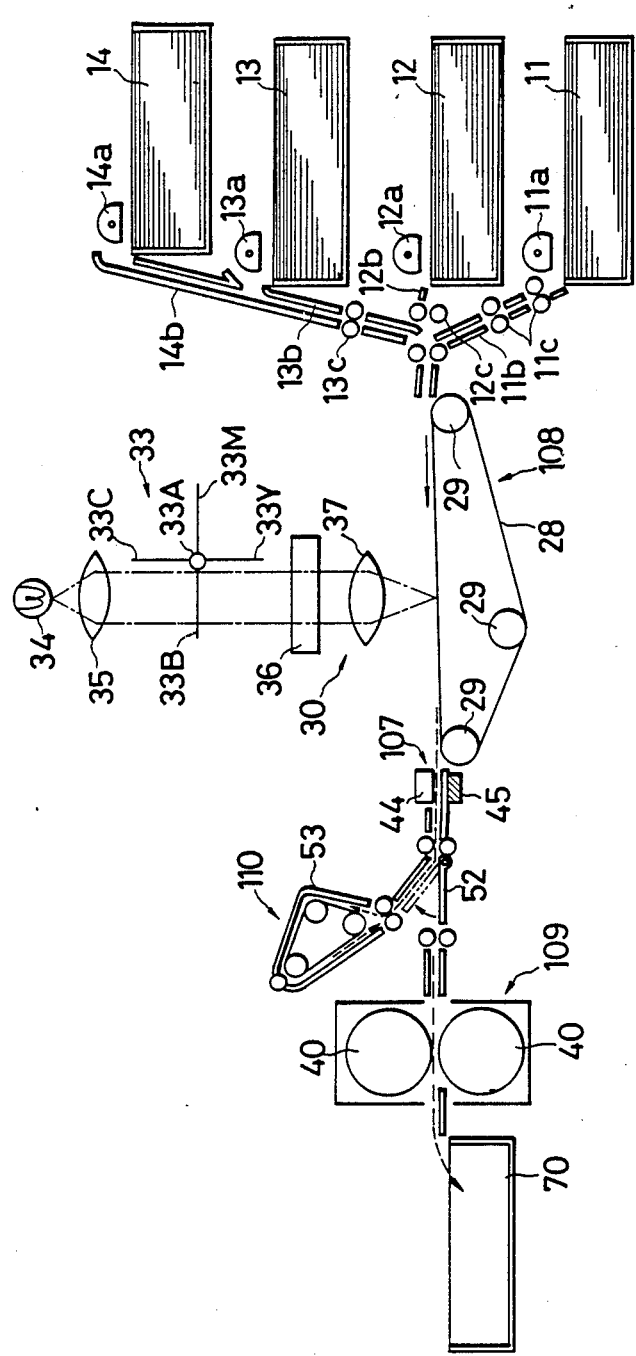
FIG. 1 is a schematic diagram of an image recording apparatus according to a first embodiment of this invention.

FIGS. 1 through 3(g) illustrate an image recording apparatus according to the first embodiment of this invention. As shown in FIG. 1, the image recording apparatus is provided with three types of photosensitive and pressure-sensitive recording sheets 11, 12 and 13 and ordinary photosensitive recording sheet 14, with each type of recording sheets being stacked in a paper tray or cassette. Above the individual recording sheets 11-14 are sheet feed rollers 11a to 14a provided to feed the respective types of recording sheets 11-14 to an image recording section 30, which will be described later, from a sheet feeding section where these sheets 11-14 are disposed. As the feed rollers 11a-14a rotate, the respective recording sheets 11-14 are inserted into sheet guides 11b-14b; since this guiding mechanism of this type of recording apparatus is well known, its detailed description will be omitted.

The photosensitive and pressure-sensitive recording sheets 11 (hereinafter also referred to as monochromatic sheets) each have a number of monochromatic micro capsules (not shown) on one surface. Those monochromatic micro capsules which have been exposed to light through monochromatic filter 33B and a shutter 36 to be described later and are therefore hardened, are not ruptured for a coloring effect when pressure is applied on the recording sheets 11. In contrast, unexposed monochromatic micro capsules are not hardened and are ruptured to provide a black color when pressure is applied on the recording sheets 11.

The photosensitive and pressure-sensitive recording sheets 12 (hereinafter also referred to as color sheets) each have a number of color micro capsules (not shown) on one surface, which contain chromogenic materials for the basic colors, cyan, magenta and yellow. The cyan micro capsules, magenta micro capsules and yellow micro capsules become hardened only by the light with the associated waveforms, and would not be hardened by light with other waveforms.

The micro capsules of each color that are hardened due to light exposure through the shutter 36 and the associated one of a cyan filter 33C, a magenta filter 33M and a yellow filter 33Y, are not ruptured when pressure is applied to the recording sheet 12. However, the unexposed, soft micro capsules are ruptured by the pressure application on the recording sheet 12.

The photosensitive and pressure-sensitive recording sheets 13 (hereinafter also referred to as double-side sheets) have a layer of monochromatic micro capsules coated on both surfaces. Each double-sided sheet 13 has its one surface first exposed to light through the monochromatic filter 33B and the shutter 36, and is then turned over by a sheet changing device 110 (which will be described later) of the recording sheet 13 so that the other surface is exposed to light. Consequently, when pressure is applied to both surfaces of the recording sheet 13, a black image is formed on either surface.

As should be clear from the above, all of the three types of photosensitive and pressure-sensitive recording sheets, 11, 12 and 13 are of a self-chromogenic type and each has a layer of a developer material on its one surface in addition to a layer of photosensitive micro capsules.

The thermal recording sheets 14 are of a conventional type which provide color by the heat from the heat generating section (not shown) of a line thermal head 44 to be described later. A monochromatic image can be formed on the thermal recording sheets 14 instead of the monochromatic photosensitive and pressure-sensitive recording sheets 11.

The sheet guides 11b to 14b are provided with the respective pairs of sheet feed rollers 11c-13c to feed the recording sheets 11-14 to a sheet feeding belt 28 which will be described later.

The recording sheets 11, 12, 13 or 14 fed via the respective sheet guide 11b, 12b, 13b or 14b are disposed on the sheet feeding belt 28 and are conveyed with the movement of this belt. The sheet feeding belt 28 moves by the rotation of a plurality of pulleys 29 that support the belt. As one of the pulleys 29 is connected to a stepping motor (not shown) through a gear, the sheet feeding belt 28 moves by a predetermined pitch when the stepping motor is driven through a predetermined angle.

Above the sheet feeding belt 28 is disposed the image recording section 30, which comprises a light source 34, a lens 35, a filter 33, the optical shutter 36 and a lens 37. Light emitted from the light source 34 is irradiated on the recording sheet 11, 12 or 13 on the sheet feeding belt 28 through the lens 35, filter 33, optical shutter 36 and lens 37. In this embodiment, the light source 34 is constituted by a fluorescent lamp.

Although not illustrated, a light-transmittive original, for example, as image information to be recorded, is disposed at the proper location in the light path of the image recording section 30. For a light-nontransmittive original, the light from the light source 34 that is reflected at the original is guided to the light path.

The filter 33 comprises the monochromatic filter 33B, the cyan filter 33C, the yellow filter 33Y and a support/driving section 33A, which supports the individual filters 33M, 33C, 33B and 33Y and rotates the filters to selectively dispose them in the light path.

The optical shutter 36 is constituted by a PLZT shutter in this embodiment, but may be of a different type that uses another magnetic fluid. The optical shutter 36, under the control of a control processing unit (hereinafter referred to as CPU) 101, shields light when a predetermined image on the recording sheet is not to be exposed and permits the light when the image is to be exposed.

The lenses 35 and 37 are disposed so as to focus the light from the light source 34 on one line of the selected one of the recording sheets 11–13. Accordingly, a selected recording sheet 11, 12 or 13 is fed on the feeding belt 28 by a predetermined pitch and each line is exposed every time. When the selected recording sheet is fed by one page, it is exposed by one page.

Each of the photosensitive and pressure-sensitive recording sheets 11–13 fed by the feeding belt 28 passes a sheet changing gate 52 to be described later and is developed and fixed by a pair of pressure fixing rollers 40. Consequently, an image is formed on the photosensitive and pressure-sensitive recording sheets 11, 12 or 13 and this recording sheet is received in a sheet receiving cassette 70.

The sheet changing device 110 comprises a guide passage 53 for turning over the recording sheet that has been fed, and the sheet changing gate 52 for selecting whether the recording sheet 13 is inserted in the passage 53 or is moved toward the pressure fixing rollers 40.

A thermal recording device 107 is disposed between the sheet changing gate 52 and the feeding belt 28. The thermal recording device 107 comprises a thermal head 44 with a one-line width, a platen 45 and a pressing-/release mechanism (not shown) which presses the thermal head 44 onto the platen 45 or releases the pressure on the thermal head 44.

Figure 2:
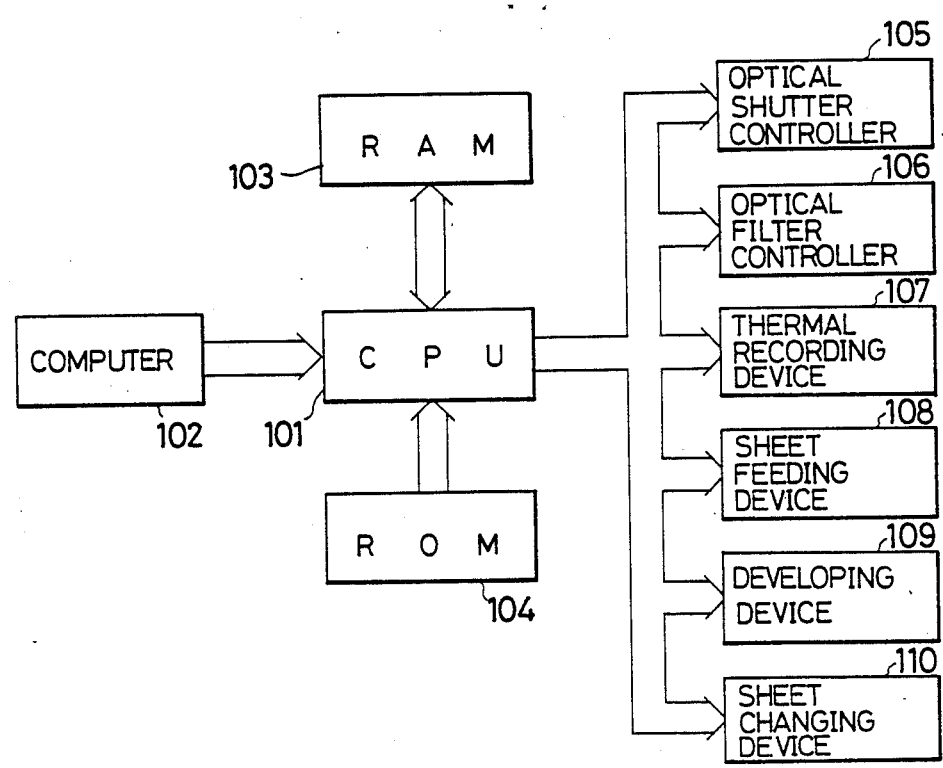
FIG. 2 is a block diagram showing a control system of the apparatus of FIG. 1.

The arrangement of the electronic control for this recording apparatus will now be explained with reference to the block diagram of FIG. 2.

The central processing unit (CPU) 101 for controlling the recording apparatus receives recording data from an external computer 102. The recording data includes image recording data such as characters to be recorded and electrically encoded data (hereinafter called a sheet code) that is provided for each type of recording sheet to specify on which recording sheet 11, 12, 13 or 14 the image recording data is to be recorded. This sheet code constitutes the selection means to select the recording sheets 11–14.

The CPU 101 is coupled to a random access memory (hereinafter called RAM) 103 that stores the recording data, and a read only memory (hereinafter called ROM) 104 that stores a program to control the CPU 101 and the image recording data that is a pattern of characters to be recorded. The ROM 104 is capable of storing data of at least one page of a recording sheet.

Further, the CPU 101 is designed to operate an optical controller 105 for controlling the optical shutter 36, an optical filter controller 106 for controlling the optical filter 33, a thermal recording device 107 for controlling the thermal head 44, a sheet feeding device 108 for controlling the sheet feed rollers 11a–14a, the sheet feeding belt 28 and other sheet feed rollers, a developing device 109 for controlling the pressure fixing rollers 40 and the sheet changing device 110 for controlling the sheet changing gate 52.

The illustrated developing device 109 has, on the back of the pressure fixing rollers 40, rollers similar to thermal fixing rollers 231 ad 232 of the second embodiment, although such an arrangement is omitted in FIG. 1.

The operation of the recording apparatus will now be explained according to the flowcharts shown in FIGS. 3(a) to 3(g).

Figure 3A:
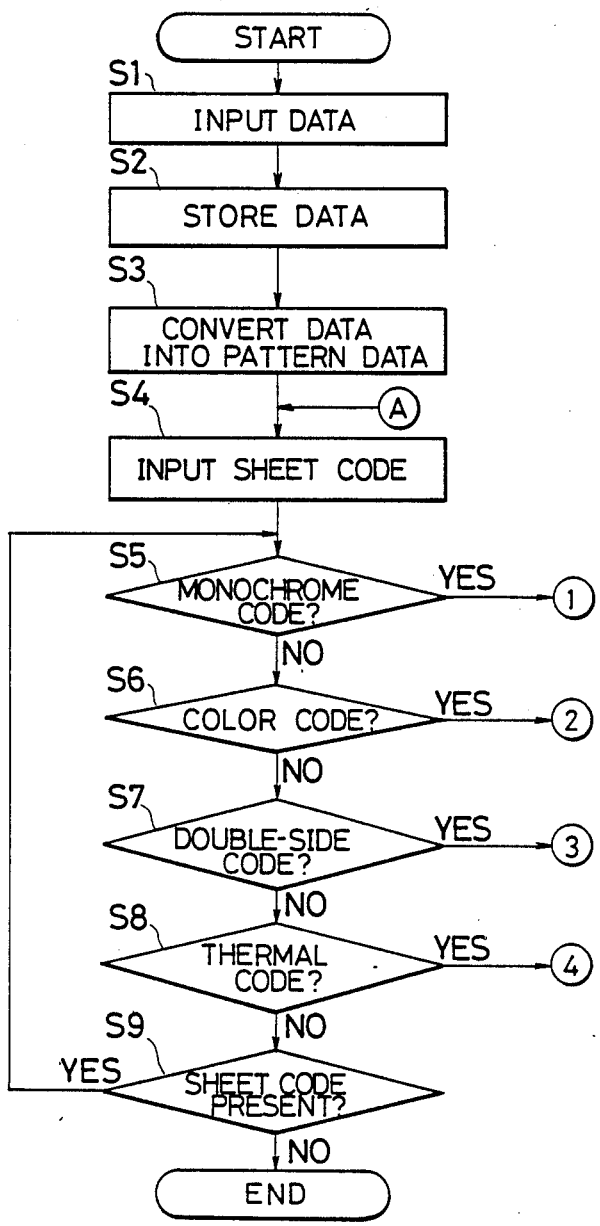

In FIG. 3(a), the CPU 101 receives data from the external computer 102 (step S1) and stores the received data (step S2). The CPU 101 then converts those data from the received data which are, for example, characters to be recorded, into pattern data (step S3) and receives the sheet code (step S4).

The CPU 101 determines whether or not the sheet code is a code to select a monochromatic photosensitive and pressure-sensitive recording sheet (the code being hereinafter referred to as a monochromatic code) (step S5). In the following description, a code to designate the color photosensitive and pressure-sensitive recording sheet 12 is called a color code, a code to designate the photosensitive and pressure-sensitive recording sheet 13 for double-side recording is called a double-side code, and a code to designate the thermal recording sheet 14 is called a thermal code.

If YES in step S5, the CPU 101 executes step S10, while if NO in step S5, the CPU 101 determines whether or not the sheet code is the color code (step S6).

If YES in step S6, the CPU 101 executes step S20, and if NO in step S6, the CPU 101 determines whether or not the sheet code is the double-side code (step S7).

If YES in step S7, the CPU 101 executes step S61, and if NO in step S7, the CPU 101 determines whether or not the sheet code is the thermal code (step S8).

If YES in step S8, the CPU 101 executes step S75, and if NO in step S8, the CPU 101 determines whether or not the sheet code is present.

If YES in step S9, the CPU 101 executes step S5, and if NO in step S9, the CPU 101 terminates the operation.

Figure 3B:
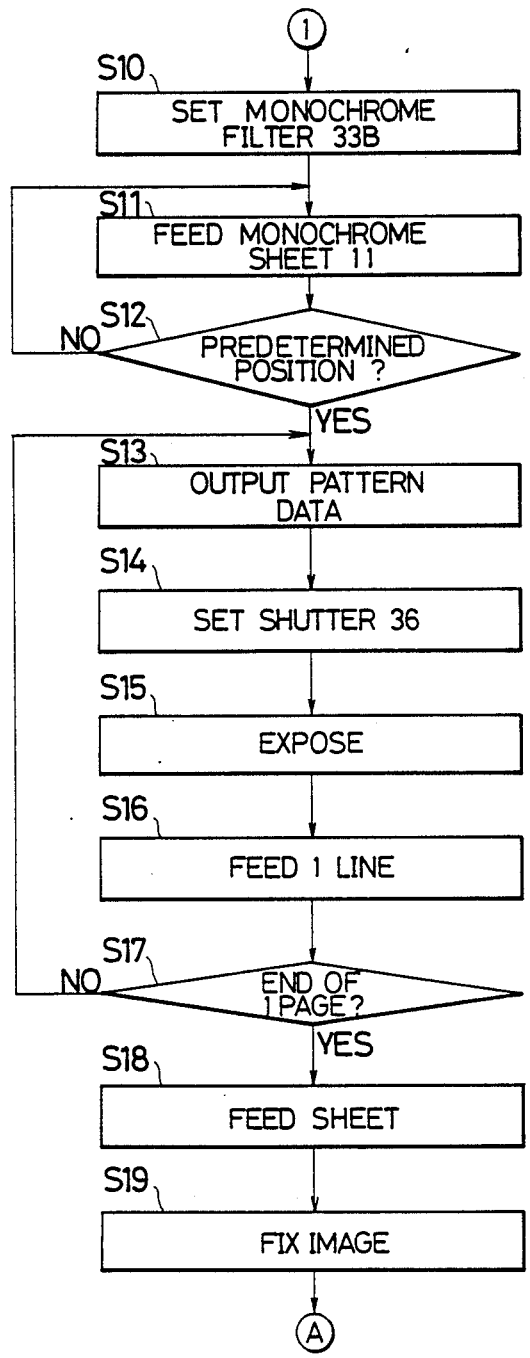

If YES in step S5, as illustrated in FIG. 3(b), the CPU 101 controls the optical filter controller 106 to set the monochromatic filter 33B (step S10). This positions the monochromatic filter 33B in the light path between the light source 34 to the photosensitive and pressure-recording sheets 11.

The CPU 101 controls the feeding device 108 to feed the monochromatic sheet 11 (step S11). Accordingly, the monochromatic sheet 11 is inserted in the sheet guide 11b by the rotation of the sheet feed roller 11a and is conveyed to an exposing position on the feeding belt 28 by the sheet feed roller 11c. The monochromatic sheet 11 is fed by the feeding belt 28 and is kept conveyed by the CPU 101 until the CPU 101 determines that the monochromatic sheet is at a predetermined position (step S12).

Here, the CPU 101 is coupled to a sensor (not shown) that detects the presence of the monochromatic sheet at the predetermined position.

The CPU 101 outputs the pattern data to the optical shutter controller 105 (step S13) and sets the optical shutter 36 via the optical shutter controller 105 (step S14). The CPU 101 then energizes the light source 34 for an exposing operation (step S15) and controls the feeding device 108 to move the feeding belt 28 by one line (step S16). In the subsequent step S17, the CPU 101 determines whether or not the exposure of one page of the recording sheet 11 is completed. If the exposure of one page of the recording sheet 11 is not completed, the CPU 101 repeats steps S13 to S17. When one page exposure is completed, a latent image is formed on the sheet 11, and the CPU 101 controls the feeding device 108 to feed the monochromatic sheet 11 to the pressure fixing rollers 40 (step S18). Then, the CPU 101 controls the developing device 109 so that the monochromatic sheet 11 is developed and fixed by the pressure fixing rollers 40 (step S19), thus forming a monochromatic image on the sheet 11. Then, the CPU 101 again executes step S4.

Figure 3C:
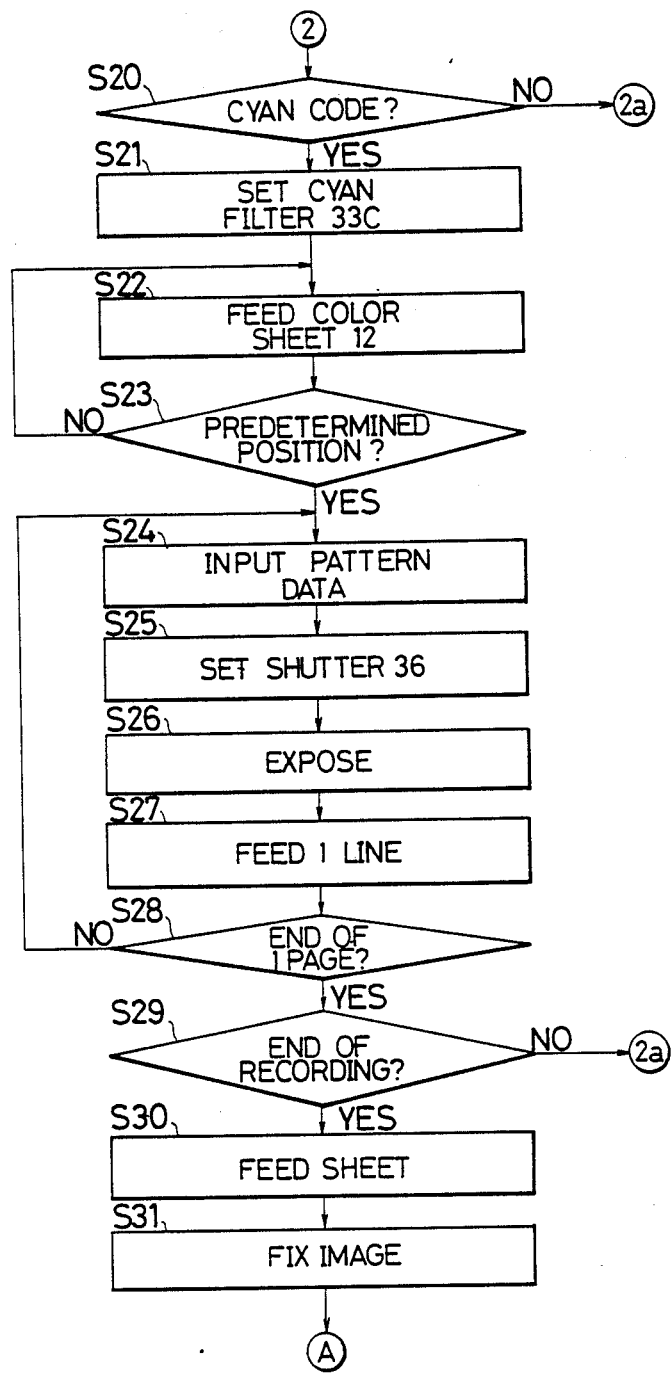

If YES in step S6, the CPU 101 determines in step S20 whether or not the sheet code is the cyan code, as shown in FIG. 3(c). If YES in step S20, the CPU 101 sets the cyan filter 33C in the aforementioned manner (step S21). Then, the CPU 101 controls the feeding device 108 to feed the color sheet 12 (step S22) and keeps the sheet feeding until it determines that the color sheet 12 is at a predetermined exposing position.

Thereafter, the CPU 101 executes steps S24 to S28 so that a cyan latent image is formed on one page of the color sheet, as per the formation of the latent image on the monochromatic sheet. The CPU 101 then determines whether or not the recording is completed with respect to the same color sheet 12 (step S29).

If YES in step S29, the CPU 101 feeds the color sheet 12 to the pressure fixing rollers 40 (step S30) and then controls the developing device 109 to form a cyan image on the color sheet 12 (step S31).

If NO in step S29, the CPU 101 determines whether or not the magenta code is present in the sheet code (step S32), as illustrated in FIG. 3(d). Here, it is determined whether or not a magenta latent image should be formed after the cyan latent image is formed on the color sheet 12. If YES in step S32, the CPU 101 sets the magenta filter 33M in the aformentioned manner (step S33).

In the subsequent step S34, the CPU 101 determines whether or not the color sheet 12 on which the magenta latent image is to be formed is the previous sheet on which the cyan latent image has been formed.

If YES in step S34, the sheet 12 is fed until the CPU 101 detects that the previous sheet 12 is at a predetermined position (steps S35 and S36).

If NO in step S34, a new color sheet 12 is fed until the CPU 101 detects that the new color sheet 12 is at the predetermined position (steps S37 and S38).

Thereafter, the CPU 101 executes steps S39 to S43, thus forming a magenta latent image on one page of the color sheet 12.

In the subsequent step S44, the CPU 101 determines whether or not forming the latent image on the same color sheet 12 is completed. If YES in step S44, the CPU 101 feeds the color sheet 12 to the pressure fixing rollers 40 (step S45) and controls the developing device 109 to form a magenta image on the color sheet 12 (step S46). In this case, when the cyan and magenta latent images are formed on the color sheet 12, an image with a mixture of the cyan and magenta colors is formed, while when only the magenta latent image is formed on the color sheet 12, an image of the magenta color is formed.

Figure 3E:
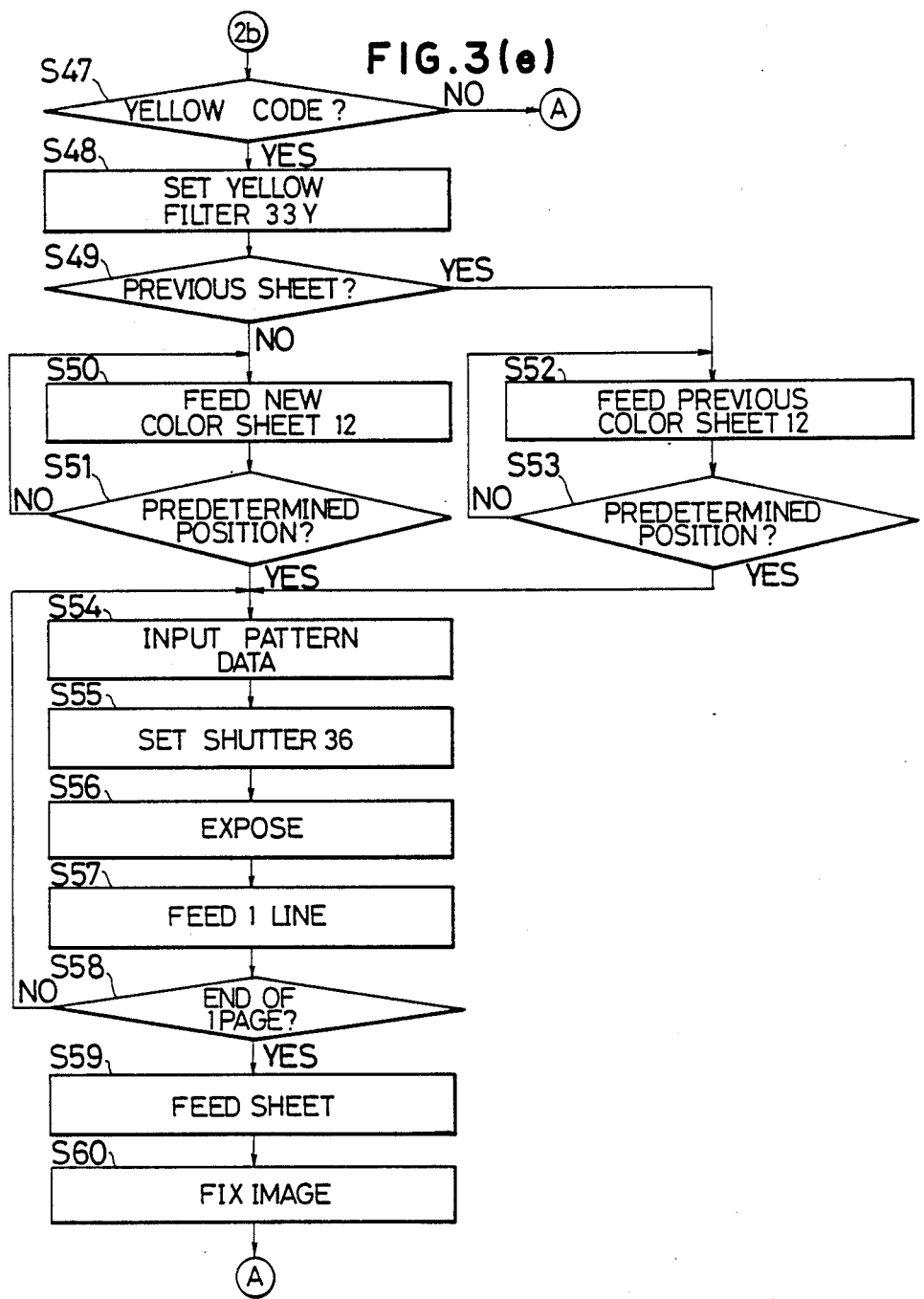

If NO in step S44, as shown in FIG. 3(e), the CPU 101 determines whether or not the yellow code is present in the sheet code (step S47).

If NO in step S47, the CPU 101 executes step S4 again.

If YES in step S47, the CPU 101 executes steps S48 to S60 so that a yellow image is formed on the color sheet 12. Therefore, when the CPU 101 executes the aforementioned steps S10 to S60, a color image is formed on the color sheet 12.

Figure 3F:
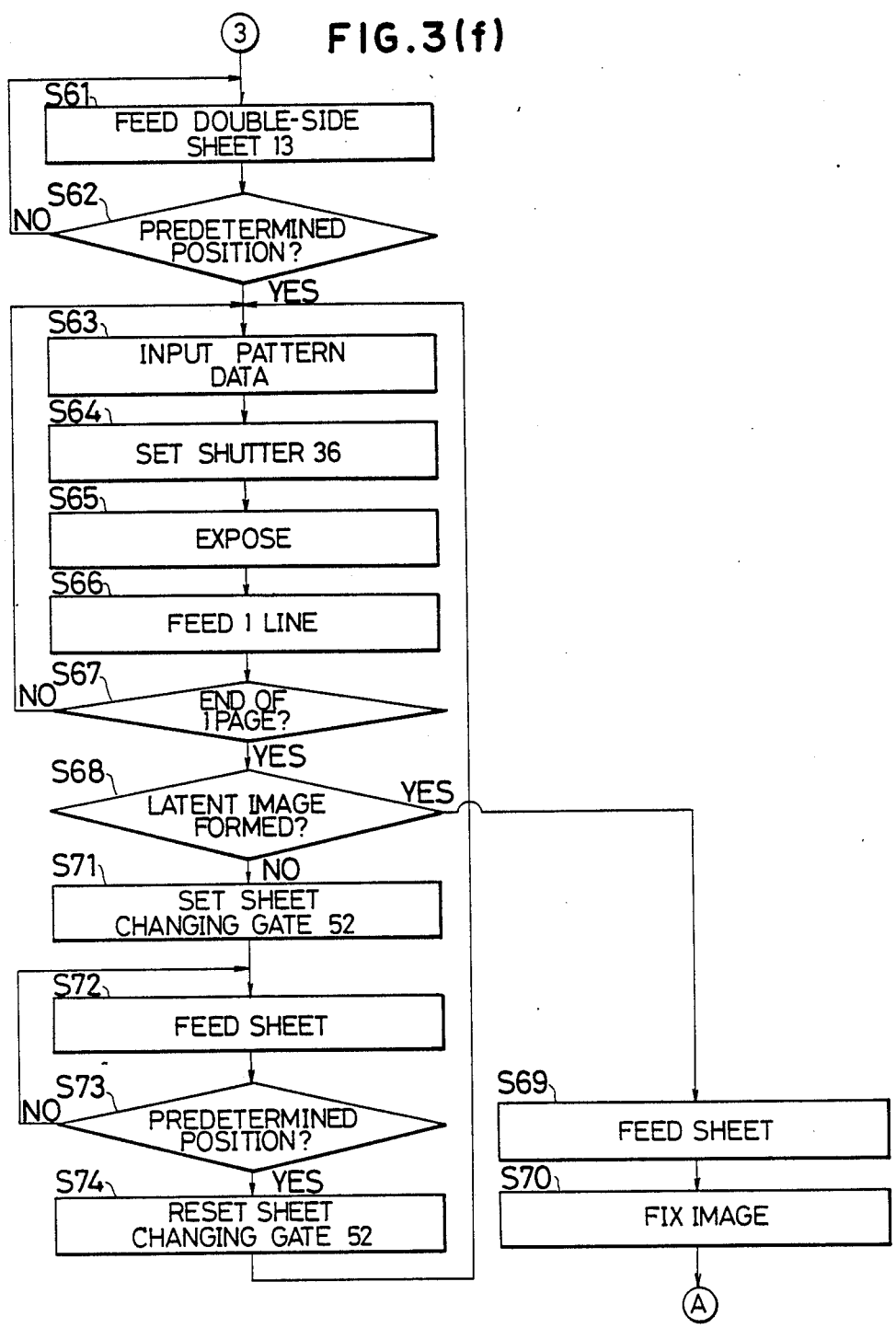

If YES in step S7, the CPU 101 feeds the double-sided sheet 13 until the sheet is detected to be at a predetermined position (steps S61 and S62), as illustrated in FIG. 3(f).

The CPU 101 then executes steps S63 to S67 and forms a latent image on one surface of the double-sided sheet 13 in the same manner as the monochromatic latent image is formed on the monochromatic sheet 11. Then, the CPU 101 determines whether or not latent images are formed on both surfaces of the double-side sheet 13 (step S68).

If YES in step S68, the double sheet 13 is fed to the pressure fixing rollers 40 (step S69) and the CPU 101 controls the developing apparatus 109 to form images on both surfaces of the double-sided sheet 13 (step S70). If NO in step S68, the CPU 101 controls the sheet changing device 110 to move the sheet changing gate 52 in the arrow direction in FIG. 1 to the changing position indicated by the chain line so that the double-sided sheet 13 is inserted into the passage 53 (step S71).

The CPU 101 then controls the feeding device 108 to feed the double-sided sheet 13 in the direction opposite to the sheet feeding direction until the double-sided sheet 13 is turned over and is fed to a predetermined position (steps S72 and S73).

When the CPU 101 detects that the double-sided sheet 13 is again at the predetermined exposing position on the belt 28, the CPU 101 controls the sheet changing device 110 to reset the sheet changing gate 52 to the original position indicated by the real line in FIG. 1 so that the double-sided sheet 13 is fed to the pressure fixing rollers 40 (step S74).

Then, the CPU 101 executes steps S63 to S67 to form a latent image on the back surface of the double-sided sheet 13.

Figure 3G:
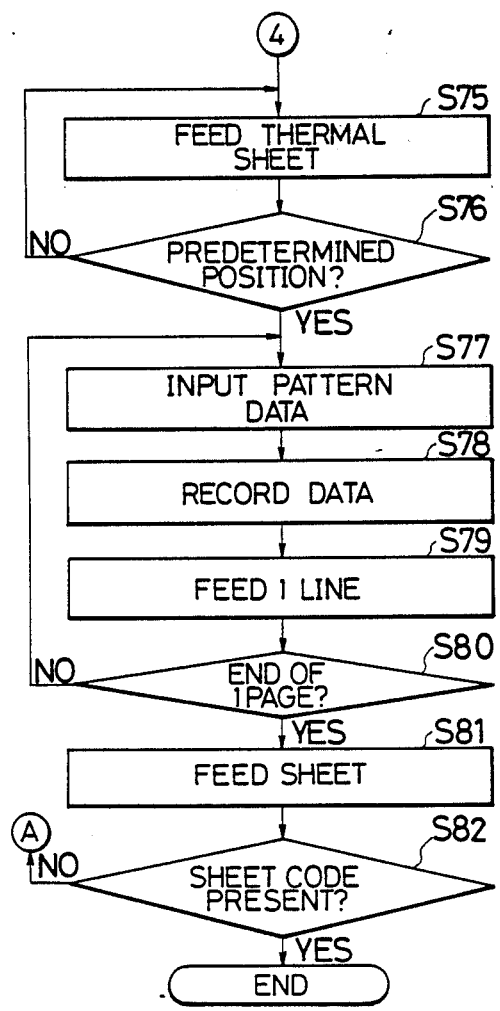

If YES in step S8, as illustrated in FIG. 3(g), the CPU 101 controls the feeding device 108 to feed the thermal sheet 14 until the sheet 14 is detected to be at a predetermined position (steps S75 and S76).

Then, the CPU 101 outputs the pattern data to the thermal recording device 107 (step S77) and controls the thermal head 44 to execute a line recording (step S78). The CPU 101 then controls the feeding device 108 to feed the thermal sheet 14 by one line (step S79) and determines whether or not a page recording is completed (step S80).

If NO in step S80, the CPU 101 executes steps S77 to S80. If YES in step S80, the CPU 101 controls the feeding device 108 to feed the thermal sheet 14 to the receiving case 70 (step S81).

In the subsequent step S82, the CPU 101 determines whether or not the sheet code is present. If YES in step S82, the CPU 101 re-executes step S4, and if NO in step S82, the CPU 101 terminates the operation.

According to this embodiment, the image recording apparatus is provided with plural types of recording sheets three of which are photosensitive and pressure-sensitive recording sheets. However, it is not necessary to provide three types of photosensitive and pressure-sensitive recording sheets; a combination of color photosensitive and pressure-sensitive recording sheets and monochromatic photosensitive and pressure-sensitive recording sheets or a combination of monochromatic photosensitive and pressure-sensitive recording sheets and double-side photosensitive and pressure-sensitive recording sheets may be provided.

Further, according to this embodiment, the thermal recording device is combined with the recording apparatus that uses photosensitive and pressure-sensitive recording sheets. As a modification, however, the thermal recording device may be combined with a recording apparatus using another xerography for better operability. Moreover, the sheet code may be output from a switch that can be selected by the users.

Figure 4:
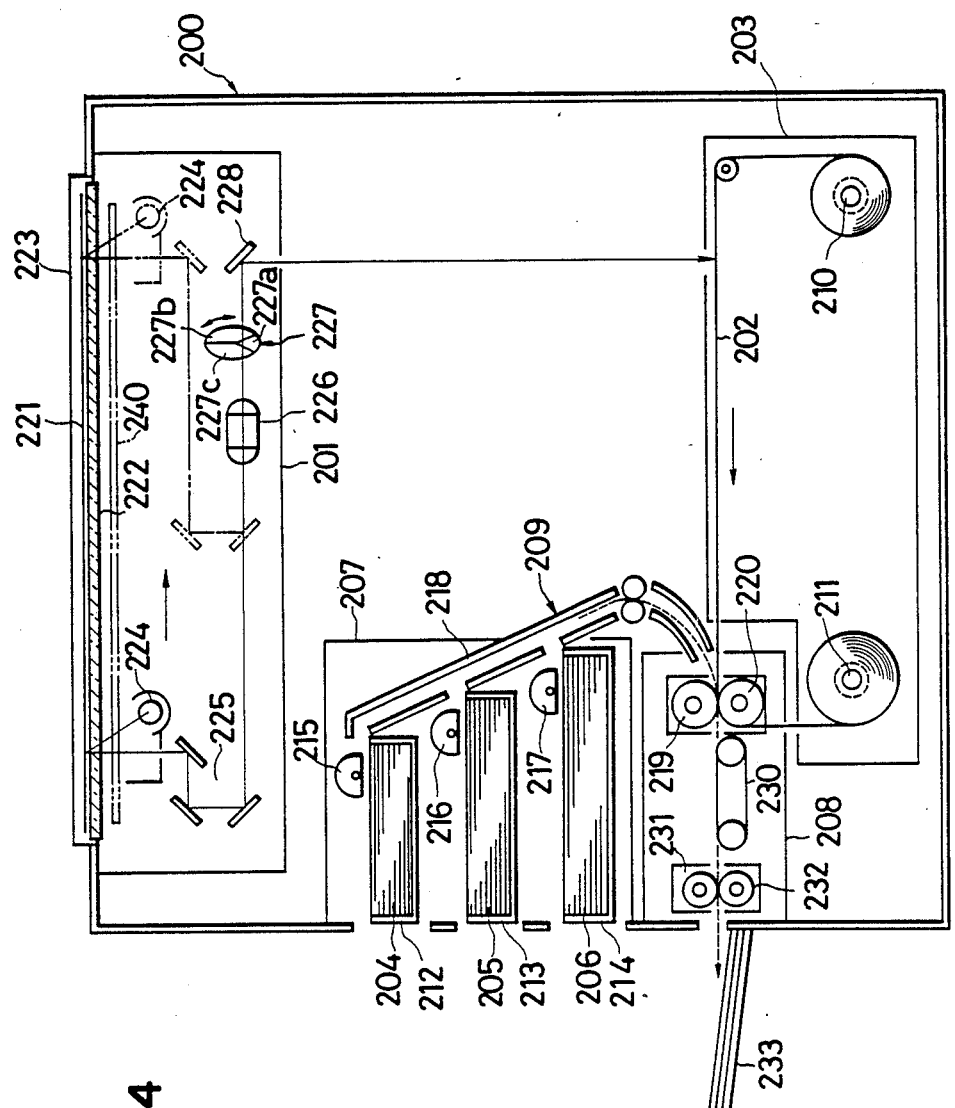
FIG. 4 is a schematic diagram of an image recording apparatus according to the second embodiment of this invention.

FIG. 4 illustrates a color image recording apparatus according to the second embodiment of this invention, which uses photosensitive and pressure-sensitive recording sheets of a transfer type. Inside a housing 200 of the image recording apparatus are an exposing unit 201, a sheet moving unit 203 for moving a continuous sheet 202, a sheet feeding unit 201 provided with cut sheets 204, 205 and 206 different in size, a developing unit 208, and a sheet feeding unit 209 for selectively feeding the individual cut sheets to the developing unit 208.

The continuous sheet 202 is tightly disposed between a pair of wind-up rollers 210 and 211 that are forward and reverse rotatable by driving a pair of motors provided in the sheet moving unit 203. The continuous sheet 202 has a layer of photosensitive micro capsules coated on its one surface, each capsule containing a cyan, magenta or yellow chromogenic material, and constitutes one of transfer type recording sheets that are to overlap each other. The cut sheets 204-206 disposed in the sheet feeding unit 207 each have a developer material coated on one surface and constitute the other one of the transfer type recording sheets. When the cut sheets and the continuous sheet are overlaid one upon another and pressed at the developing unit 208, the developer material reacts with the chromogenic material encapsulated in the micro capsules on the continuous sheet 202 to provide various colors and transfer a color image on the cut sheets.

The cut sheets 204-206 of this embodiment correspond to the different types of recording sheets 111-114 in the first embodiment, and the selective feeding of these cut sheets 204-206 is performed in the same manner as done in the first embodiment.

The cut sheets 204-206 are stacked in sheet feeding cassettes 212, 213 and 214, respectively, and are fed through a sheet guide 218 between a pair of pressure developing rollers 219 and 220 of the developing unit 208 by the selective rotation of sheet feed rollers 215, 216 and 217 and are overlaid with the continuous sheet 202 there.

The roller 220, i.e., one of the pressure developing rollers 219 and 220, is located at the end portion of the horizontal moving path of the continuous sheet 202 that moves in the arrow direction, and movably anchors the continuous sheet 202, thus having the function of the moving unit 203.

The exposing unit 201 has a fixed original table 222 of transparent glass on which an original 221 is disposed, and an original cover 223. Under the original table 222 lies an exposing lamp 224 as a light source. The light emitted to the original 221 from the lamp 224 and reflected downward of the original table 222 is projected onto the continuous sheet 202 through a plurality of mirrors 225, an image-forming lens 226, a three-color separation filter 227, and the last, fixed mirror 228, thereby forming a latent image corresponding to the original 221. The lamp 224 is moved, as indicated by the chain line, in the arrow direction in FIG. 4 so as to scan the original 221.

The three-color separation filter 227 comprises a red filter section 227a, a green filter section 227b and a blue filter section 227c. In accordance with the spectral sensitivities of the individual micro capsules on the continuous sheet 202, the red filter section 227a permits only the light with the waveform to harden the cyan micro capsules, the green filter section 227b permits only the light with the waveform to harden the magenta micro capsules, and blue filter section 227c permits only the light with the waveform to harden the yellow micro capsules. These filter sections 227a-227c are selectively positioned in the light path by rotating the filter 227. This filter 227 provides the same effect as the filter 33 of the first embodiment.

The developing unit 208 further has a feeding belt 230 and a pair of thermal fixing rollers 231 and 232.

When the selected cut sheet and the continuous sheet 202 are overlaid one upon another at the pressure developing rollers 219 and 220, an image is transferred from the continuous sheet onto the cut sheet. The cut sheet is then guided to the thermal fixing rollers 231 and 232 by means of the feeding belt 230 and is subjected to a thermal fixing there, and is discharged onto a tray 233, as indicated by the arrow.

In FIG. 4, the exposure frame 240 indicated by the two-dot chain line is disposed below the original table 222 and between this table and the exposing lamp 224.

Figure 5:
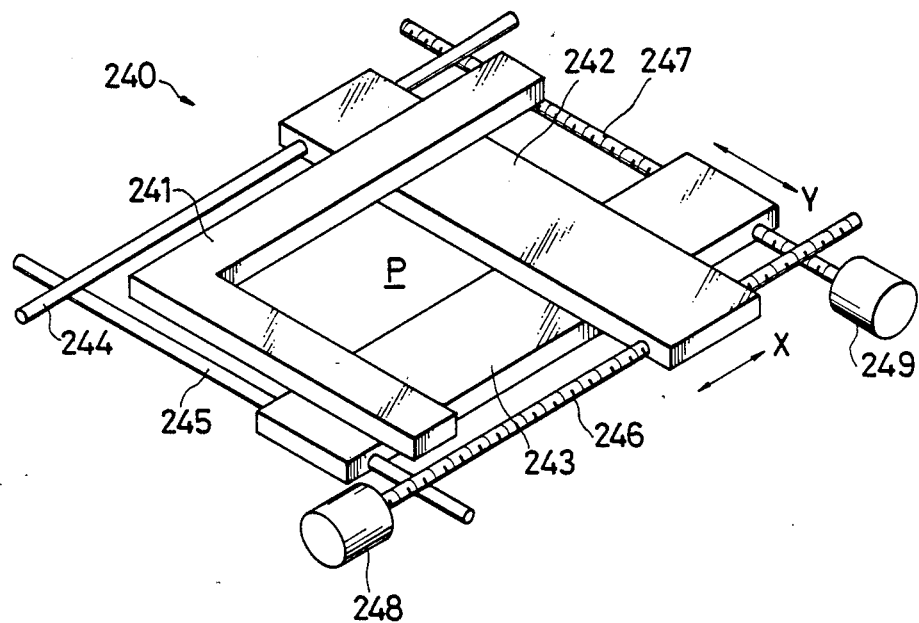
FIG. 5 is a perspective view showing an exposure frame disposed in the apparatus of FIG. 4.

As shown in FIG. 5, the exposure frame 240 comprises an L-shaped fixed frame 241 of a plate member and X-directionally and Y-directionally movable frames 242 and 243 of a wide plate member, and has a square frame shape. An opening P which permits the irradiation light from the light-source lamp 224 and the reflection light from the original 221 to pass there-through is formed in the exposure frame 240. The bottom surface of each of the frames 241, 242 and 243 (the bottom side of the sheet in FIG. 5) is coated with a paint having a spectral reflectivity that makes the light with a waveform to harden the associated micro capsules on the continuous sheet 202 to be reflectable.

Both of the movable frames 242 and 243 are movably supported by guide rods 244 and 245 and screw rods 246 and 247, respectively. When the screw rods 246 and 247 are rotated by an X-direction driving motor 248 and a Y-direction driving motor 249, which are respectively fixed to the screw rods 246 and 247 and are each constituted by a stepping motor, the movable frames 242 and 243 are moved in the X and Y directions in FIG. 5, thus changing the size of the opening P in accordance with the size of the original 221. The guide rods 244 and 245, the screw rods 246 and 247, and the X-direction and Y-direction driving motors 248 and 249 constitute moving means to relatively move the individual frames 241, 242 and 243.

Figure 6:
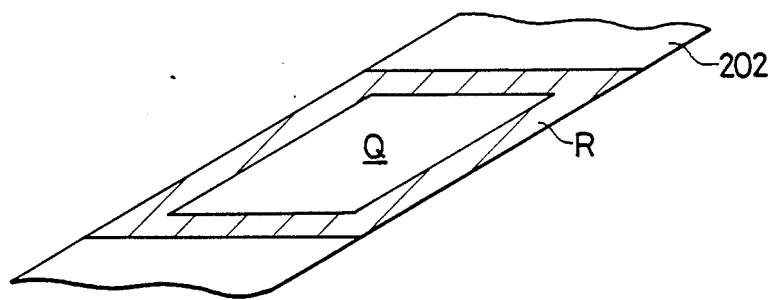
FIG. 6 is a diagram illustrating an image area adjusted on a continuous sheet by the exposure frame of FIG. 5.

According to the apparatus of this embodiment, for instance, when the size of the next original 221 to be recorded differs or the size of the cut sheet 204, 205 or 206 for enlarging the original 221 differs, the individual driving motors 248 and 249 are driven by operating a switch on an operation panel 43 (see FIG. 7) provided on the apparatus, so that the movable frames 242 and 243 are moved to adjust the area of the opening P of the exposure frame 240 in accordance with the size of the original 221 or the sheet 204, 205 or 206. And as illustrated in FIG. 6, an image area Q on the photosensitive and pressure-sensitive continuous sheet 202 that corresponds to the opening P is adjusted and a non-image area R formed by the exposure frame 28 is adjusted accordingly.

The non-image area R is exposed to light by the reflection light from the bottom surface of the exposure frame 240 so that the micro capsules in this non-image area on the continuous sheet 202 are hardened. When the continuous sheet 202 is overlaid on the selected one of the cut sheets 204-206 and pressed, the micro capsules of the non-image area R are ruptured, which prevents the chromogenic materials in the capsules from flowing out and thus prevents the pressure developing rollers 219 and 220 from being stained by the action. Consequently, a stainless image transfer is possible on the selected cut sheet, thus always ensuring the recording of a clear image.

Figure 7:
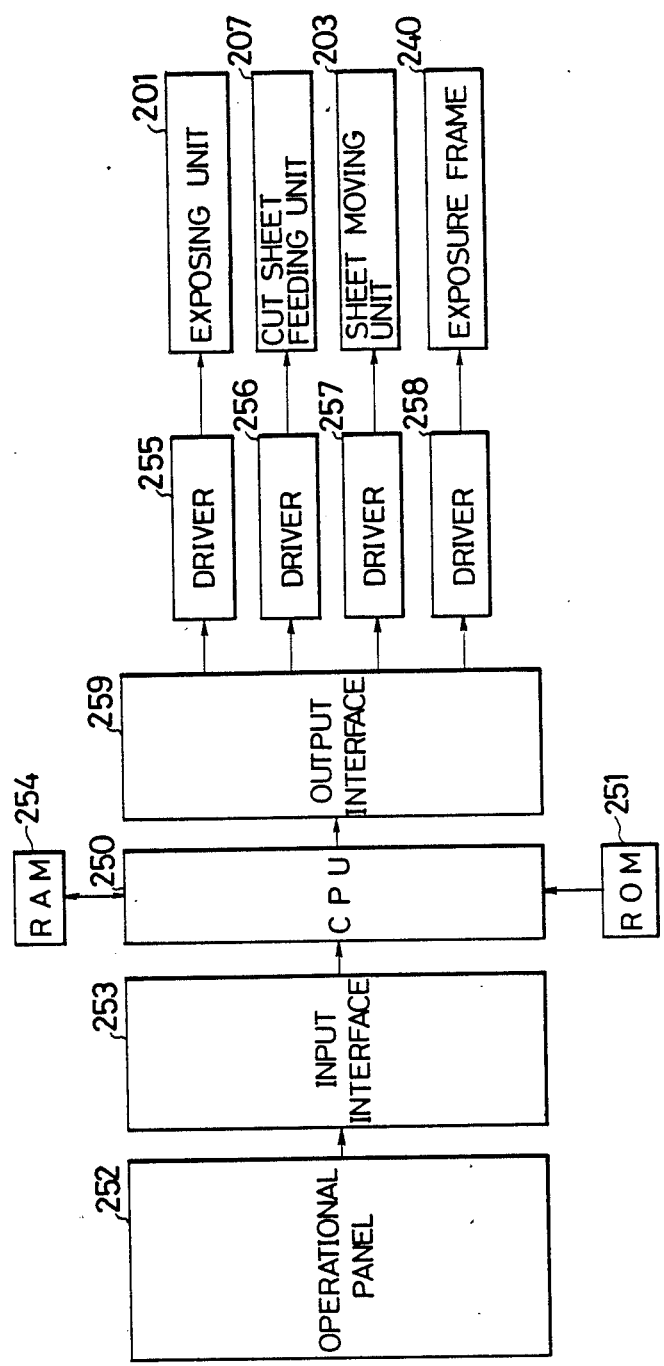
FIG. 7 is a block diagram illustrating a control system of the apparatus of FIG. 4.

A control circuit for the color image recording apparatus will now be briefly explained with reference to FIG. 7. A CPU 250 controls this apparatus according to a program stored in a ROM 251. The CPU 250 is coupled through an input interface 253 to the operational panel 252 and receives various types of signals, which are stored in a RAM 254. The CPU 250 is coupled to the exposing unit 201, cut sheet feeding unit 207, sheet moving unit 203 and exposure frame 240 respectively through drivers 255, 256, 257 and 258 and an output interface 259, and outputs driving signals thereto.

Like the CPU 101 of the first embodiment, the CPU 250 selects the recording sheets 204–206 using sheet codes corresponding to these sheets and executes a sequence of image recording operations according to the selection. As this control is done in the same manner as is done in the first embodiment, its detailed explanation will be omitted.

Although the present invention has been explained in terms of the first and second embodiments, it is needless to say that this invention is not particularly limited to these embodiments, but may be modified in various manners within the scope of the invention.

What is claimed is:

1. An image recording apparatus comprising:
a sheet feeding section provided with plural types of recoding sheet means, at least one of which is a photosensitive and pressure-sensitive recording sheet means, said photosensitive and pressure-sensitive recording sheet means having a number of microcapsules on one surface of the sheet means which is able to change its mechanical hardness due to light exposure and contains chromogenic material which is adapted to react with developer material;
an image recording section having image recording means operable to form an image on each recording sheet means;
selection means operable to select one type of recording sheet means from said plural types of recording sheet means;
feeding means operable to feed the recording sheet means selected by said selection means from said sheet feeding section to said image recording section;
control means connected to said selection means and said feeding means for operating said selection means and said feeding means respectively, and causing said image recording means to form an image on said selected recording sheet means; and
pressure applying means connected to said control means for applying pressure on said photosensitive and pressure-sensitive recording sheet means, when said selection means selects the photosensitive and pressure-sensitive recording sheet means.

2. The image recording apparatus according to claim 1, wherein said selection means comprises encoded information corresponding to said plural types of recording sheet means so as to specify said plural types of recording sheet means; and
said control means comprises discrimination means for automatically discriminating said encoded information and drives said feeding means and said image recording means in accordance with a discrimination result.

3. The image recording apparatus according to claim 1, wherein one of said plural types of recording sheet means is a color sheet provided with a layer of the developer material and a layer of the pressure rupturable microcapsules each containing chromogenic material which is adapted to react with the developer material.

4. The image recording apparatus according to claim 1, wherein one of said plural types of recording sheet means is a self-chromogenic type double-sided sheet having, on both surfaces, layers of pressure rupturable microcapsules each containing the chromogenic material; and
said feeding means has turnover means for turning over said double-sided sheet that has once been fed to said image recording section and feeding said turned double-sided sheet again to said recording section.

5. The image recording apparatus according to claim 1, wherein said control means drives said turnover means in accordance with selection information indicating that said selection means has selected said double-side sheet.

6. An image recording apparatus comprising:
a sheet feeding section provided with plural types of recording sheets, at least one of which is a photosensitive and pressure-sensitive recording sheet;
an image recording section having image recording means operable to form an image on a recording sheet;
selection means for selecting a type of said plural types of recording sheets;
feeding means operable to feed a recording sheet from said sheet feeding section to said image recording section;
control means for causing said selection means to select one type of a recording sheet from said plural types of recording sheets, causing said feeding means to feed said selected recording sheet to said image recording section, and causing said image recording means to form an image on said selected recording sheet; and
pressure applying means connected to said control means for applying pressure on said photosensitive and pressure-sensitive recording sheet means, when said selection means selects the photosensitive and pressure sensitive recording sheet means,
said image recording means including an exposing unit for exposing an image at said image recording section through a light path, exposure frame means, disposed in said light path, for adjustably defining an area of said image to be exposed, and operation means for operating said exposure frame means to adjust said area of said image in accordance with the size of said selected recording sheet.

7. An image recording apparatus comprising:
a sheet feeding section provided with plural types of cut sheets different in size, each of which has a layer of a developer material formed on one surface thereof;
sheet moving means operable to move a continuous sheet having a layer of pressure rupturable micro capsules formed on one surface thereof, in a lengthwise direction of said continuous sheet;
exposing means operable to expose an image on said continuous sheet;

feeding means operable to select an arbitrary type of a cut sheet from said plural types of cut sheets and feed said selected cut sheet from said sheet feeding section in such a manner that said selected cut sheet and said continuous sheet overlie one upon another;

developing means for applying a pressure on said overlaid continuous sheet and selected cut sheet so as to transfer said exposed image on said continuous sheet onto said selected cut sheet and fix said transferred image on said selected cut sheet; and control means for driving said exposing means, said sheet moving means and said feeding means.

8. The image recording apparatus according to claim 7, wherein said developing means includes a pressure roller movably anchoring said continuous sheet and constituting part of said sheet moving means.

9. The image recording apparatus according to claim 1, wherein said exposure frame means includes at least a pair of plate members having a spectral reflectivity to allow said photosensitive and pressure-sensitive recording sheet to be exposed, and has a square frame shape.

10. An image recording apparatus comprising:

a sheet feeding section provided with plural types of recording sheet means, at least one of which is a photosensitive and pressure-sensitive recording sheet means;

an image recording section having image recording means operable to form an image on each recording sheet means;

selection means operable to select one type of recording sheet means from said plural types of recording sheet means;

feeding means operable to feed the recording sheet means selected by said selection means from said sheet feeding section to said image recording section;

control means connected to said selection means and said feeding means for operating said selection means and said feeding means respectively, and causing said image recording means to form an image on said selected recording sheet means; and pressure applying means connected to said control means for applying pressure on said photosensitive and pressure-sensitive recording sheet means, when said selection means selects the photosensitive and pressure-sensitive recording sheet means.

11. An image recording apparatus comprising:

a sheet feeding section provided with plural types of recording sheets which are transfer type cut sheets each provided with a developer material;

an image recording section having image recording means operable for image-forming;

pressure applying section having pressure applying means;

a continuous sheet which is disposed to move through said image recording section and said pressure applying section, said continuous sheet being provided with a layer of pressure rupturable microcapsules each containing a chromogenic material which is adapted to react with the developer material;

selection means operable to select one type of the recording sheets;

feeding means operable to feed the recording sheet selected by said selection means from said sheet feeding section to said pressure applying section so as to overlay the selected recording sheet on the continuous sheet in the pressure applying section;

control means connected to said selection means and said feeding means for operating the selection means and the feeding means respectively, and causing said image recording means to form and image on the continuous sheet in the image recording section and then causing said pressure applying means to apply a pressure on the selected recording sheet and the continuous sheet, thereby to transfer the formed image on the continuous sheet to the selected recording sheet in association with reaction of the chromogenic material in the continuous sheet with the developer material in the recording sheet.

12. The image recording apparatus according to claim 11, further comprising:

discharging means for discharging the selected recording sheet outside the apparatus after the image has been transferred to the recording sheet; and roller means for feeding and winding up said continuous sheet thereon inside the apparatus.

* * * * *